(12) United States Patent
Bao et al.

(10) Patent No.: US 9,799,737 B2
(45) Date of Patent: *Oct. 24, 2017

(54) METHOD FOR FORMING GROUP III/V CONFORMAL LAYERS ON SILICON SUBSTRATES

(71) Applicant: Applied Materials, Inc., Santa Clara, CA (US)

(72) Inventors: Xinyu Bao, Fremont, CA (US); Errol Antonio C. Sanchez, Tracy, CA (US); David K. Carlson, San Jose, CA (US); Zhiyuan Ye, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/185,749

(22) Filed: Jun. 17, 2016

(65) Prior Publication Data
US 2016/0343811 A1    Nov. 24, 2016

Related U.S. Application Data

(63) Continuation of application No. 14/100,720, filed on Dec. 9, 2013, which is a continuation of application
(Continued)

(51) Int. Cl.
| H01L 29/205 | (2006.01) |
|---|---|
| H01L 29/267 | (2006.01) |
| H01L 21/02 | (2006.01) |

(52) U.S. Cl.
CPC ........ *H01L 29/205* (2013.01); *H01L 21/0262* (2013.01); *H01L 21/02381* (2013.01);
(Continued)

(58) Field of Classification Search
USPC .................................................. 438/681, 906
See application file for complete search history.

(56) References Cited

U.S. PATENT DOCUMENTS

| 4,711,858 A | 12/1987 | Harder et al. |
| 5,141,893 A | 8/1992 | Ito et al. |

(Continued)

FOREIGN PATENT DOCUMENTS

| CN | 101283456 A | 10/2008 |
| CN | 101901834 A | 12/2010 |

(Continued)

OTHER PUBLICATIONS

Office Action and Search Report for Chinese Application No. 201380016402.4 dated May 4, 2016.
(Continued)

*Primary Examiner* — Fernando L Toledo
*Assistant Examiner* — Valerie N Newton
(74) *Attorney, Agent, or Firm* — Patterson + Sheridan LLP

(57) ABSTRACT

A method for forming a conformal group III/V layer on a silicon substrate and the resulting substrate with the group III/V layers formed thereon. The method includes removing the native oxide from the substrate, positioning a substrate within a processing chamber, heating the substrate to a first temperature, cooling the substrate to a second temperature, flowing a group III precursor into the processing chamber, maintaining the second temperature while flowing a group III precursor and a group V precursor into the processing chamber until a conformal layer is formed, heating the processing chamber to an annealing temperature, while stopping the flow of the group III precursor, and cooling the processing chamber to the second temperature. Deposition of the III/V layer may be made selective through the use of
(Continued)

halide gas etching which preferentially etches dielectric regions.

20 Claims, 3 Drawing Sheets

Related U.S. Application Data

No. 13/436,644, filed on Mar. 30, 2012, now Pat. No. 8,603,898.

(52) U.S. Cl.
CPC .. *H01L 21/02455* (2013.01); *H01L 21/02538* (2013.01); *H01L 21/02694* (2013.01); *H01L 29/267* (2013.01); *Y10T 117/1008* (2015.01)

(56) References Cited

U.S. PATENT DOCUMENTS

| | | |
|---|---|---|
| 5,212,113 A | 5/1993 | Azoulay et al. |
| 5,244,834 A | 9/1993 | Suzuki et al. |
| 5,402,748 A | 4/1995 | Takai et al. |
| 5,456,206 A | 10/1995 | Lee et al. |
| 5,993,542 A | 11/1999 | Yanashima et al. |
| 6,498,048 B2 | 12/2002 | Morita |
| 6,508,879 B1 | 1/2003 | Hashimoto |
| 6,727,523 B2 | 4/2004 | Morita |
| 7,078,318 B2 | 7/2006 | Jurgensen et al. |
| 7,928,427 B1 | 4/2011 | Chang |
| 7,955,437 B2 | 6/2011 | Shibata et al. |
| 8,080,466 B2 | 12/2011 | Su et al. |
| 8,084,337 B2 | 12/2011 | Samuelson et al. |
| 8,603,898 B2 * | 12/2013 | Bao ................ H01L 21/02381 117/202 |
| 2004/0115853 A1 | 6/2004 | Kobayashi et al. |
| 2006/0278891 A1 | 12/2006 | Saxler et al. |
| 2008/0032478 A1 | 2/2008 | Hudait et al. |
| 2008/0264332 A1 | 10/2008 | Sepehry-Fard |
| 2009/0117675 A1 | 5/2009 | Yamanaka et al. |
| 2009/0253250 A1 | 10/2009 | Samuelson et al. |
| 2010/0140735 A1 | 6/2010 | Bommena et al. |
| 2010/0301393 A1 | 12/2010 | Teraguchi |
| 2011/0045659 A1 | 2/2011 | Hudait et al. |
| 2012/0211870 A1 | 8/2012 | Figuet et al. |
| 2013/0171805 A1 | 7/2013 | Kraus et al. |

FOREIGN PATENT DOCUMENTS

| | | |
|---|---|---|
| JP | 2010-509177 A | 3/2010 |
| WO | 9925030 A1 | 5/1999 |

OTHER PUBLICATIONS

Office Action for U.S. Appl. No. 13/436,644 dated Mar. 28, 2013.
Office Action for U.S. Appl. No. 14/100,720 dated May 26, 2015.
Final Office Action for U.S. Appl. No. 14/100,720 dated Dec. 17, 2015.
International Preliminary Report on Patentability for International Application No. PCT/US2013/028648 dated Oct. 9, 2014.
International Search Report and Written Opinion for International Application No. PCT/US2013/028648 dated Jun. 27, 2013.
Search Report for Taiwan Application No. 102110684 dated Sep. 6, 2016.

\* cited by examiner

METHOD FOR FORMING GROUP III/V CONFORMAL LAYERS ON SILICON SUBSTRATES

CROSS-REFERENCE TO RELATED APPLICATIONS

This application claims benefit of U.S. patent application Ser. No. 14/100,720, filed Dec. 9, 2013, which claims benefit of U.S. patent application Ser. No. 13/436,644, filed Mar. 30, 2012, and now issued as U.S. Pat. No. 8,603,898, all of which are herein incorporated by reference in their entirety.

BACKGROUND OF THE INVENTION

Field of the Invention

Embodiments of the invention generally relate to processes for forming group III/V materials on a silicon substrate using a group III nucleation layer.

Description of the Related Art

Group III/V semiconductors have significant potential as useful materials in high-temperature, high frequency and high power microelectronics and ultra-violet/blue/green optoelectronics by virtue of their wide bandgaps, high thermal conductivities and large electrical breakdown fields. Microelectronic device applications include AlGaNGaN multilayer-based laser diodes, high electron mobility transistors (HEMTs), field effect transistors (FETs), heterojunction bipolar transistors (HBTs), light emitting diodes (LEDs) and ultra-violet photodetectors, as well as (Al,In,Ga) N-based devices generally, including devices for high-frequency, high-power communications, for high-density optical storage, full-color displays, and for other wide bandgap semiconductor applications.

Further, surface layers capable of achieving the performance advantages of group III/V materials may host a variety of high performance electronic devices such as CMOS and quantum well (QW) transistors fabricated from extreme high mobility materials such as, but not limited to, indium antimonide (InSb) and indium arsenide (InAs). Optical devices such as lasers, detectors and photovoltaics may also be fabricated from various other direct band gap materials, such as, but not limited to, gallium arsenide (GaAs) and indium gallium arsenide (InGaAs).

Despite the advantages and utility of such layers, the growth of group III/V materials on silicon substrates presents many challenges. Crystal defects can be generated by lattice mismatch, polar-on-nonpolar mismatch and thermal mismatch between the group III/V semiconductor epitaxial layer and the silicon semiconductor substrate. When the lattice mismatch between the epitaxial layer and substrate exceeds a few percent, the strain induced by the mismatch becomes too great and defects are generated in the epitaxial layer when the epitaxial film relaxes.

Once the film thickness is greater than the critical thickness (film is strained below this thickness and relaxed above this thickness), the strain is relaxed by creating misfit dislocations at the film and substrate interface as well as in the epitaxial film. The epitaxial crystal defects are typically in the form of threading dislocations, stacking faults and twins (periodicity breaks where one portion of the lattice is a mirror image of another). Many defects, particularly threading dislocations, tend to propagate into the "device layer" where the semiconductor device is fabricated. Generally, the severity of defect generation correlates to the amount of lattice mismatch between the group III/V semiconductor and the silicon substrate.

Various buffer layers have been used in attempts to relieve the strain induced by the lattice mismatch between the silicon substrate and the group III/V device layer and thereby reduce the detrimental defect density of the III/V layer. However, layer uniformity between different surface orientations of the silicon substrate has remained a constant problem.

A related difficulty to depositing group III/V layers for CMOS features is conformal deposition on silicon substrates. Traditionally, in heteroepitaxy, buffer layers must be grown to be very thick, such as a buffer layer which is 1 or more microns thick, to overcome the mismatch between the layers and create a high quality crystalline film.

As such, the formation of a conformal layer on different crystal orientations requires the deposition of a thick layer to accommodate for above crystal defects which is not optimal for small feature formation in CMOS.

Therefore, there is a general need for a deposition process with a high deposition rate that can deposit group III/V films uniformly over a large substrate or multiple substrates without regard for lattice mismatch, polar-on-nonpolar mismatch or other difficulties. Further, there is a need in the art for an improved deposition method which does not require a thick buffer layer for the growth of group III/V crystalline layers on a silicon substrate.

SUMMARY OF THE INVENTION

Embodiments of the invention generally relate to methods for forming group III/V layers using a group III nucleation layer. The group III/V layer can be any group III/V layer and can be deposited under normal conditions for metal organic chemical vapor deposition (MOCVD) known in the literature. It is important that the deposition be conformal over various surface orientations while simultaneously producing a high quality crystalline film.

In one embodiment, a method for forming a conformal layer on a substrate is provided which can include positioning a substrate within a processing chamber after removing the native oxide from the substrate, heating the substrate to a first temperature, cooling the substrate to a second temperature, and flowing a group III precursor into the processing chamber to seed the substrate.

One or more embodiments can further include maintaining the processing chamber at the second temperature while flowing a group III precursor and a group V precursor into the processing chamber until a conformal binary III/V layer is formed. The processing chamber can then be heated to a third temperature, while stopping the flow of the group III precursor. Processing terminates after subsequent cooldown back to the second temperature.

In another embodiment, the method for forming a conformal layer on a substrate can include positioning a substrate within a processing chamber, adjusting the temperature of the processing chamber to a first temperature, flowing a group III precursor into the processing chamber to create a nucleation layer, flowing a group III precursor and a group V precursor into the processing chamber to create a binary III/V buffer layer, heating the processing chamber to a second temperature, while stopping the flow of the second group III precursor, cooling the processing chamber to the first temperature, sequentially repeating the precursor, annealing and cooling steps until the desired binary III/V buffer layer thickness is reached.

In some embodiments, a silicon substrate can include an upper surface with both dielectric and semiconductor regions with a group III nucleation layer disposed on at least one surface of the silicon substrate, wherein the group III nucleation layer is composed of one or more group III elements, and a group III/V buffer layer on top of the group III nucleation layer.

In one or more embodiments, the substrate can further include one or more binary or ternary group III/V layers formed on the buffer layer. The binary or ternary group III/V layers can include one or more group III and one or more group V elements, which can be composed of the same group III or the same group V element as used in either the buffer layer or the nucleation layer and can be a conformal layer.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

Figure 1A:
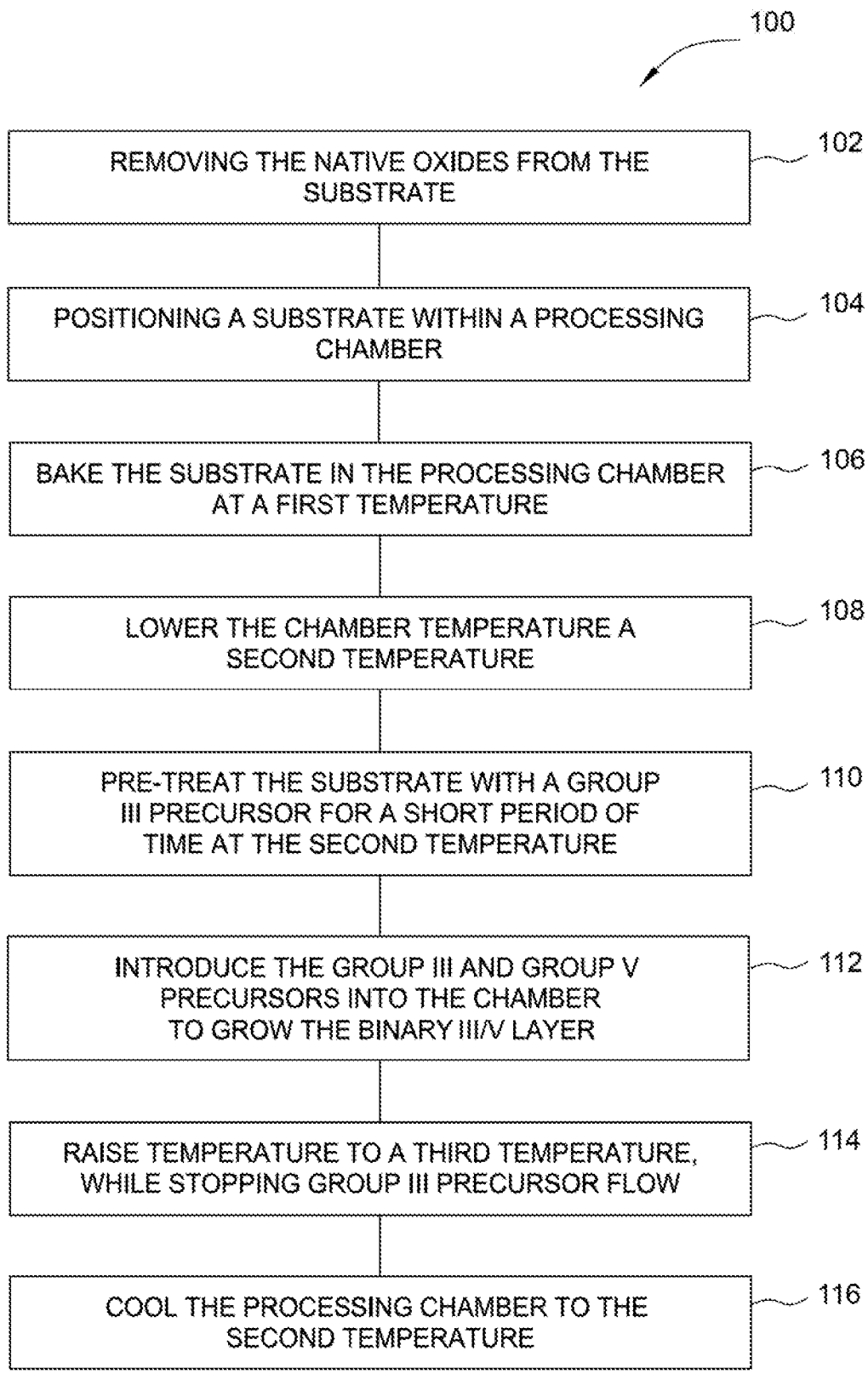
FIG. 1A depicts a flow diagram of the method for forming a nucleation layer and a buffer layer on a substrate, according to one or more embodiments.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention generally relate to methods for forming group III/V materials on silicon surfaces and the resulting composition forming a buffer layer on a nucleation layer composed of a group III element. In one embodiment, a method for forming a conformal layer on a substrate is provided which can include removing the native oxide from the substrate, positioning a substrate within a processing chamber, heating the substrate to a first temperature, cooling the substrate to a second temperature, and flowing a group III precursor into the processing chamber. The group III precursor can be selected from all known group III precursors.

The first temperature, which can correspond to a post cleaning step, can range from about 400° C. to about 800° C., with preferred embodiments ranging from about 400° C. to about 500° C. The post cleaning step can be used to remove remaining contaminants from the surface of the substrate. The second temperature, which can correspond to a layer formation step, can range from about 250° C. to about 400° C., such as about 290° C. to about 340° C., with a preferred embodiment of 300° C. In one or more embodiments, the group III precursor can be flowed into the processing chamber for up to 15 seconds, such as a range of about 3 to about 10 seconds, with preferred embodiments ranging from about 3 to about 5 seconds.

One or more embodiments can include maintaining the processing chamber at the second temperature, flowing a group III precursor and a group V precursor into the processing chamber until a conformal layer between 5 nm and 50 nm thick is formed, heating the processing chamber to a third temperature, while stopping the flow of the group III precursor, and cooling the processing chamber to the second temperature. The method can include stopping the group V precursor flow to the processing chamber when the process is complete. The conformal III/V layer formed by the addition of the group V precursor, after treatment with the group III precursor, can be between 5 nm and 100 nm thick, more specifically between 5 nm and 50 nm and with preferred embodiments of between 10 nm and 30 nm. The third temperature, which can be an annealing temperature, can range from about 400° C. to about 600° C., with preferred embodiments from about 450° C. to about 550° C. The group V precursor can be selected from all known group V precursors.

Group III and group V precursors used in binary or ternary III/V layers are chosen according to the specific electrical property desired. Group III precursors can include Trimethyl Indium, Trimethyl Gallium, Triethyl Gallium, and Trimethyl Aluminum. Group V precursors can include Tertiarybutylarsine, Tertiarybutyl Phosphine, Triethyl Antimony, Arsine ($AsH_3$), and Phosphine ($PH_3$).

In one or more embodiments, the group III precursor used in any of the described layers can be the same group III precursor group as any other layer. Further, the group III precursor can be flowed into the processing chamber as a continuous flow from the nucleation layer step to the buffer layer formation.

One or more embodiments can also include the use of halide gases, such as chlorine or hydrogen chloride, to control deposition of the group III/V layers. The halide gas can be used in either a thermal etching process or a plasma assisted etching process to primarily etch the dielectric regions of substrate. As such, group III and group V elements can be removed preferentially from the surface of the dielectric regions, allowing deposition to accumulate only on semiconductor regions.

In another embodiment, a method for forming a conformal layer can also include maintaining the processing chamber at the second temperature, flowing at least one group III precursor and at least one group V precursor, wherein three precursor gases are used, into the processing chamber until a conformal ternary group III/V layer is formed on a group III/V layer, heating the processing chamber to the third temperature, while stopping the flow of the group III precursor, cooling the processing chamber to the second temperature, and stopping the group V precursor flow to the processing chamber to terminate the process.

In another embodiment, a method for forming a conformal III/V layer on a substrate can include positioning a substrate within a processing chamber, adjusting the temperature of the processing chamber to a second temperature, flowing a group III precursor into the processing chamber, maintaining the second temperature while flowing a group III precursor and a group V precursor into the processing chamber until a film is formed, heating the processing chamber to a third temperature, while stopping the flow of the group III precursor, cooling the processing chamber to the second temperature, sequentially repeating the buffer precursor, annealing and cooling steps until the desired buffer layer thickness is reached, wherein the sequence can be repeated one or more times, and stopping the group V precursor flow to the processing chamber.

In one or more embodiments, the incremental buffer layer created by the sequential repeat can be limited to no more than 50 nm of thickness per repeat, such as the incremental buffer layer of up to 30 nm thick, with a preferred embodiment of the incremental buffer layer up to 20 nm thick.

In another embodiment, a silicon substrate can include an upper surface with both dielectric and semiconductor regions, a group III nucleation layer disposed on at least one surface of the silicon substrate, wherein the group III nucleation layer is composed of one or more group III elements, and a group III/V buffer layer on top of the group III nucleation layer. The combined nucleation layer and the buffer layer can be from 50Å to 500Å thick, such as from 50Å to 400Å thick with preferred embodiments including from 100Å to 300Å thick.

In one embodiment, the thin conformal group III/V layer can include one or more binary or ternary group III/V layers formed on the buffer layer. The binary or ternary group III/V layers can be in any order with respect to each other. The one or more binary or ternary group III/V layers can be composed of the same group III or the same group V element or compound as the buffer layer in any conceivable permutation of the above combination. The group III element in the nucleation layer can be the same as the group III element in the buffer layer or the binary or ternary group III/V layer. The group III and group V elements used in any of the above layers can be of any type available in a group III or group V precursor.

The binary or ternary group III/V layers can cover the one or more surfaces conformally and without regard to orientation of the silicon, such as a group III/V layer that is conformal over the (100) and (110) orientation of a silicon substrate. Examples of binary layers can include Gallium phosphide (GaP), Indium phosphide (InP), or Indium Arsenide (InAs). Examples of ternary layers can include Indium Gallium Arsenide (InGaAs) or Aluminum Indium Arsenide (AlInAs).

FIG. 1A depicts a flow diagram of a method 100 for forming a nucleation layer and a buffer layer on a substrate, according to one or more embodiments.

Before positioning the substrate, the method 100 can include removing the native oxides from the substrate, as in step 102. The procedure for attempting to remove any surface oxide can include various wet etches, generally concluding with a dip in dilute Hydrofluoric Acid (HF). Removal of surface oxides can also include using a dry etching process, such as plasma or thermal methods employing $NH_3$ diluted with $H_2$.

The method 100 can include positioning the substrate in a processing chamber, as in step 104. The processing chamber can be of any type commonly used for MOCVD processes. Though the invention described here focuses on MOCVD processes, it is envisioned that other processes known in the art for deposition of the III/V layer, such as vapor phase epitaxy (VPE) or molecular beam epitaxy (MBE) methods, may be used.

Within the processing chamber, the substrate can be heated at a first temperature, as in step 106, at which point the residual contaminants are removed from the substrate. The chamber can be heated from about 400° C. to about 900° C., with preferred embodiments ranging from about 550° C. to about 650° C.

The pre-treatment of the substrate can include lowering the chamber temperature to a second temperature, as in step 108. At the lower temperature, which can range from about 250° C. to about 400° C., such as about 290° C. to about 340° C., with a preferred embodiment of 300° C., the nucleation layer can deposit on the exposed surface of the substrate.

The method can include pretreatment of the substrate with a group III precursor for a short period of time at the second temperature, as in step 110. This will deposit a thin conformal nucleation layer of the group III precursor on the exposed surfaces of the substrate. The short period of time should be no more than 15 seconds, such as a range of 3-10 seconds, with preferred embodiments of 3-5 seconds.

After deposition of the nucleation layer, the method can include flowing a group III precursor and a group V precursor into the chamber to grow a binary group III/V buffer layer, as in step 112. The buffer layer can be grown from up to 50 nm thick, in one or more embodiment from 5 to 40 nm thick, and in some preferred embodiments the buffer layer can be from about 10 to 30 nm thick. The buffer layer can be composed of a binary or ternary III/V film, with preferable embodiments employing a binary III/V film.

After the buffer layer has deposited on the nucleation layer, the method can include raising the temperature to a third temperature while stopping the group III precursor flow, as in step 114. The third temperature can be a temperature which can properly anneal the layer on the substrate to make it very crystalline. The third temperature can range from about 400° C. to about 600° C., with preferred embodiments of from about 450° C. to about 550° C. The chamber should be increased to the third temperature within 15 seconds of finishing growth of the buffer layer to assure proper annealing and formation of the crystalline structure.

Not wishing to be bound by theory, it is believed that the group III precursor has a better sticking coefficient which allows the group III precursor to bind more effectively to the silicon substrate while simultaneously creating a binding site for the group V precursor. The group V precursor will not create a nucleation layer which can serve as a surface for III/V layer growth. Therefore, the group V precursor flow is continued after stopping the group III precursor flow to saturate the binding sites left by the group III precursor on the substrate without the expectation of continued layer growth.

Once the binary III/V layer has been annealed, the chamber can be cooled to the second temperature, as in step 116. The group V precursor can be stopped simultaneously with the cooling of the chamber, if the process is to be terminated. Otherwise, after this step 116, one or more binary or ternary group III/V layers can be formed on the buffer layer.

It is important to note that when creating the buffer layer, it is preferential to form a binary III/V layer on the surface of the nucleation layer. The formation of a ternary III/V layer as the buffer layer can be less stable for subsequent layer growth.

It is not necessary that further layers be formed on the substrate. The annealed layer can be the deposited III/V layer used in subsequent processes.

Figure 1B:
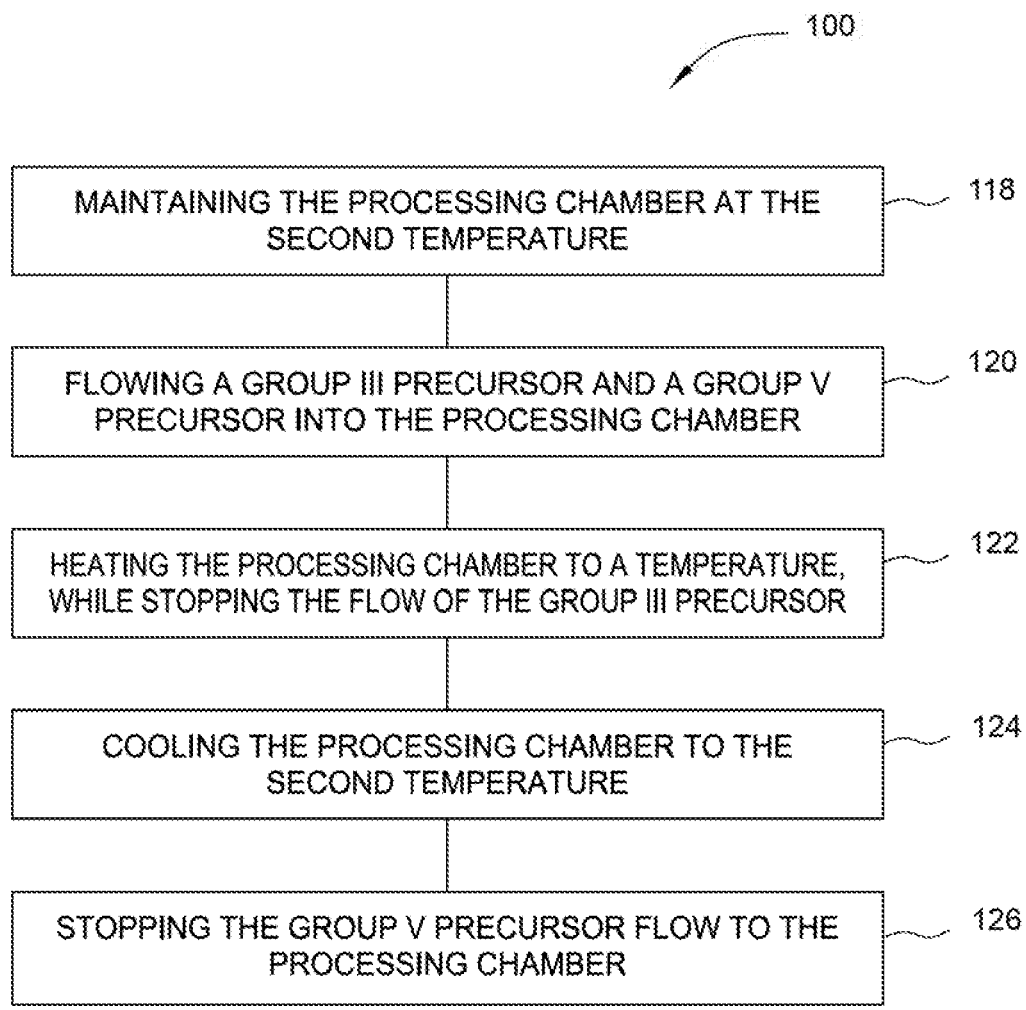
FIG. 1B depicts a flow diagram of the method for forming a binary or ternary group III/V layer on a substrate with a nucleation layer and buffer layer formed, according to one or more embodiments.

FIG. 1B depicts a flow diagram of the method for forming a binary or ternary group III/V layer on a substrate with a nucleation layer and buffer layer formed, according to one or more embodiments.

Once the buffer layer has been completed, the method can include maintaining the processing chamber at the second temperature, as in step 118. At this point, the binary and ternary III/V layers can be layered in any order. Further, there is no required composition for the binary or ternary III/V layers. They can contain the same or different group III or group V elements from the previous layers.

At the second temperature, the method can include flowing a group III precursor and a group V precursor into the processing chamber, as in step 120. The precursors can be mixed in this or subsequent layers with no detrimental effect on quality. The flow of the precursors should be continued until a desired III/V layer thickness is achieved.

Once the binary or ternary III/V layer has been deposited, the method can include heating the chamber to a third temperature while stopping the flow of the group III precursor, as in step 122. As above, the spike in temperature helps form a more crystalline structure in the III/V layer. Preferably, the heat spike should be done within 15 seconds of stopping the flow of the group III precursor, though it is possible to wait longer.

After the heat spike, the processing chamber can be cooled to the second temperature, as in step 124.

Once the chamber has cooled, the flow of the group V precursor to the processing chamber can be stopped, as in step 126, to terminate the process.

Though this embodiment includes a more detailed description of the binary and ternary III/V layer deposition process, it is contemplated that the binary and ternary III/V layers may be deposited by any method that can be used to deposit a group III/V layer. Techniques for depositing group III/V layers include MOCVD, VPE and MBE.

Figure 2:
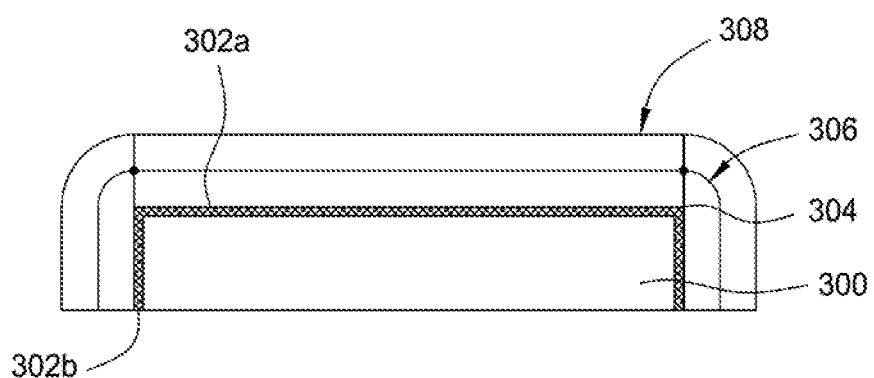
FIG. 2 depicts the substrate with group III/V layers formed thereon by one or more of the previously described methods.

FIG. 2 depicts the substrate with group III/V layers formed thereon by one or more of the previously described methods.

The silicon substrate 300 can have one or more exposed surfaces, such as 302a and 302b. The exposed surfaces can be of a different surface orientation, such as silicon with (100) or (110) orientation. Though the examples list only two surface orientations, the embodiments described here are not to be considered limited to only those orientations.

The silicon substrate 300 can have a nucleation layer 304 deposited on the one or more exposed surfaces 302. The nucleation layer 304 can be less than or equal to 50Å, such as 10Å. Further, the nucleation layer can be primarily composed of one or more group III elements, such as aluminum (Al), gallium (Ga), or indium (In).

A buffer layer 306 can be disposed over the exposed portions of the nucleation layer 304. The buffer layer 306 can be a binary III/V layer and can be substantially crystalline. Further, the buffer layer 306 can be conformally deposited over the nucleation layer 304. The buffer layer can be between up to 50 nm thick, such as between 5 and 40 nm thick, with preferred embodiments of between 10 nm and 30 nm thick.

A group III/V layer 308 can be disposed over the exposed portions of the buffer layer 306. The group III/V layer 308 can be either a binary or ternary III/V layer and can be conformally deposited over the exposed surface of the buffer layer 306.

Though this embodiment shows only one group III/V layer 308, other embodiments may have one or more group III/V layers, which may be in any order with regards to binary or ternary layers and may be of any thickness within the range of thicknesses available for group III/V layers.

Thus, methods for the deposition of a conformal group III/V layer over a silicon substrate having a group III nucleation layer are provided. The novel method of epitaxially growing a group III/V layer has numerous advantages over the prior art including formation on any surface orientation, much thinner layers, faster throughput and higher quality crystalline structures. This is beneficial for the production of any feature that requires the deposition of group III/V layers, such as CMOS production. Exposed regions of silicon can be covered by the conformal group III layer which allows for the deposition of conformal subsequent group III/V layers.

While the foregoing is directed to embodiments of the present invention, other and further embodiments of the invention may be devised without departing from the basic scope thereof, and the scope thereof is determined by the claims that follow.

The invention claimed is:

1. A method of forming a layer, comprising:
   positioning a substrate in a processing chamber, the substrate comprising an exposed surface;
   delivering a nucleation gas comprising a first group III precursor to the exposed surface of the substrate while depositing a nucleation layer on the exposed surface, the nucleation gas being free of a group V precursor;
   delivering a second group III precursor and a group V precursor to the nucleation layer while depositing a group III/V layer on the nucleation layer; and
   continuing to flow the group V precursor while stopping the flow of the second group III precursor.

2. The method of claim 1, wherein the processing chamber is heated to from about 550° C. to about 650° C. prior to delivering the nucleation gas comprising the first group III precursor.

3. The method of claim 2, wherein the processing chamber is cooled to about 250° C. to about 400° C. after the processing chamber is heated and prior to delivering the nucleation gas comprising the first group III precursor.

4. The method of claim 3, wherein the processing chamber is heated to about 450° C. to about 550° C. while stopping the flow of the second group III precursor.

5. The method of claim 1, wherein the first group III precursor and the second group III precursor are aluminum, gallium, indium or combinations thereof.

6. The method of claim 1, wherein the group III/V layer is a ternary layer.

7. The method of claim 1, wherein the group III/V layer is less than 50nm thick.

8. A method of forming a layer, comprising:
   cleaning an exposed surface of a substrate;
   depositing a group III nucleation layer over the exposed surface at a first temperature, the group III nucleation layer being free of a group V element;
   depositing a binary or ternary group III/V layer on the group III nucleation layer at a second temperature; and
   annealing the binary or ternary group III/V layer.

9. The method of claim 8, wherein the group III nucleation layer is deposited to a thickness of between 10 nm and 30 nm.

10. The method of claim 8, wherein the second temperature is higher than the first temperature.

11. The method of claim 8, further comprising depositing one or more additional binary or ternary group III/V layers and annealing the additional binary or ternary group III/V layers.

12. The method of claim 11, wherein at least one of the additional binary or ternary group III/V layers comprises a group III element or a group V element which is different from the previous binary or ternary group III/V layer.

13. The method of claim 12, wherein the second temperature is maintained during the deposition of the one or more additional binary or ternary group III/V layers.

14. The method of claim 8, wherein the binary or ternary group III/V layer is annealed at a temperature between about 400° C. and about 600° C.

15. A device, comprising:
   a silicon substrate comprising:
   a first surface; and
   a second surface disposed opposite the first surface;

a group III nucleation layer disposed on the first surface of the silicon substrate, wherein the group III nucleation layer being free of a group V element; and a group III/V buffer layer on top of the group III nucleation layer, wherein the combined nucleation layer and the group III/V buffer layer are from 50 Å to 300 Å thick.

16. The device of claim 15, further comprising one or more binary or ternary group III/V layers formed on the group III/V buffer layer.

17. The device of claim 16, wherein the one or more binary or ternary group III/V layers are composed of the same group III or the same group V element as the group III/V buffer layer.

18. The device of claim 15, wherein the group III nucleation layer and the group III/V buffer layer comprise aluminum, gallium, indium or combinations thereof.

19. The device of claim 15, wherein the group III/V buffer layer comprises phosphorus, arsenic or combinations thereof.

20. The device of claim 15, wherein the group III/V buffer layer is a binary layer.

* * * * *